(12) United States Patent
Kathman et al.

(10) Patent No.: US 7,092,416 B2
(45) Date of Patent: Aug. 15, 2006

(54) INTEGRATED WAVELENGTH LOCKER FOR USE WITH MORE THAN ONE WAVELENGTH AND ASSOCIATED METHODS

(75) Inventors: Alan Kathman, Charlotte, NC (US); John Barnett Hammond, Charlotte, NC (US); Robert Te Kolste, Charlotte, NC (US); Alvaro Cruz Cabrera, Concord, NC (US)

(73) Assignee: Digital Optics Corporation, Charlotte, NC (US)

( * ) Notice: Subject to any disclaimer, the term of this patent is extended or adjusted under 35 U.S.C. 154(b) by 204 days.

(21) Appl. No.: 10/661,771

(22) Filed: Sep. 15, 2003

(65) Prior Publication Data

US 2004/0146077 A1 Jul. 29, 2004

Related U.S. Application Data

(63) Continuation of application No. PCT/US01/21272, filed on Jul. 6, 2001, which is a continuation-in-part of application No. 09/543,760, filed on Apr. 5, 2000, now Pat. No. 6,661,818.

(51) Int. Cl.
*H01S 3/13* (2006.01)
(52) U.S. Cl. .................. 372/29.01; 372/29.02
(58) Field of Classification Search ............ 372/29.01
See application file for complete search history.

(56) References Cited

U.S. PATENT DOCUMENTS

| | | |
|---|---|---|
| 5,283,845 A * | 2/1994 | Ip .................. 385/24 |
| 5,428,700 A | 6/1995 | Hall |
| 5,666,225 A | 9/1997 | Colbourne |
| 5,784,507 A | 7/1998 | Holm-Kennedy et al. |
| 5,798,859 A | 8/1998 | Colbourne et al. |
| 5,825,792 A | 10/1998 | Villeneuve et al. |
| 5,828,689 A | 10/1998 | Epworth |
| 5,896,201 A | 4/1999 | Fukushima |
| 6,005,995 A | 12/1999 | Chen et al. |
| 6,043,883 A | 3/2000 | Leckel et al. |
| 6,235,141 B1 | 5/2001 | Feldman et al. |
| 6,323,987 B1 | 11/2001 | Rinaudo et al. |
| 6,345,060 B1 | 2/2002 | Copner et al. |
| 6,377,592 B1 | 4/2002 | Auracher et al. |
| 2002/0041562 A1 | 4/2002 | Redmond et al. |
| 2002/0172237 A1* | 11/2002 | Murry et al. .................. 372/18 |

FOREIGN PATENT DOCUMENTS

| | | |
|---|---|---|
| EP | 0 875 743 | 11/1997 |
| EP | 0 911 621 | 4/1999 |

(Continued)

OTHER PUBLICATIONS

Patent Abstracts of Japan, vol. 013, No. 507 (E-845), Nov. 14, 1989 & JP 01 205486 A (Hitachi Electron Eng Co Ltd), Aug. 17, 1989, Abstract.

*Primary Examiner*—Armando Rodriguez
(74) *Attorney, Agent, or Firm*—Lee & Morse, P.C.

(57) ABSTRACT

A wavelength locker for use at more than one wavelength includes filters with different characteristics for a corresponding detector. The filters may be etalons having different free spectral ranges, e.g., having different apparent or real thicknesses. If more than three such filters are used outputting offset periodic signals, a reference detector may be eliminated and continuous operation over a wavelength range may be realized.

24 Claims, 6 Drawing Sheets

FOREIGN PATENT DOCUMENTS

| | | |
|---|---|---|
| EP | 1 052 526 | 11/2000 |
| WO | WO 95/20144 | 7/1995 |
| WO | WO 97/05679 | 2/1997 |
| WO | WO 98/43327 | 10/1998 |
| WO | WO 99/04466 | 1/1999 |
| WO | WO 99/18612 | 4/1999 |

\* cited by examiner

INTEGRATED WAVELENGTH LOCKER FOR USE WITH MORE THAN ONE WAVELENGTH AND ASSOCIATED METHODS

CROSS-REFERENCES TO RELATED APPLICATIONS

The present application is a continuation of PCT/US01/21272 entitled "Integrated Wavelength Locker for Use with More Than One Wavelength and Associated Methods" filed on Jul. 6, 2001, a continuation-in-part of U.S. patent application Ser. No. 09/543,760 entitled "An Etalon, a Wavelength Monitor/locker Using The Etalon and Associated Methods" filed on Apr. 5, 2000, now U.S. Pat. No. 6,661,818, and claims priority under 35 U.S.C. §119 to U.S. Provisional Application No. 60/275,696 filed on Mar. 15, 2001, the entire contents of all of which are hereby incorporated by reference for all purposes.

FIELD OF THE INVENTION

The present invention is directed to a tunable wavelength monitor/locker using an etalon for use with more than one wavelength, more particularly to an integrated wavelength locker which can be placed in an optical path of an application beam or in an optical path of a monitor beam.

BACKGROUND OF THE INVENTION

Some radiation sources exhibit wavelength drift over time in excess of that tolerable for many applications. For many applications, the wavelength stability is required to be within 0.05 nm from a desired wavelength. This drift becomes increasingly important as the lifetimes over which these radiation sources are to be deployed increases. Factors such as temperature, age, operating power level, etc., all affect the output wavelength. By monitoring at least one of the direction of the wavelength change, the degree of the change and the percentage of the light being radiated at the different wavelengths, any or all factors which may be causing this change can be modified in accordance with the monitored signal via a feedback loop to stabilize the wavelength of the radiation source. Preferably, both the power and the wavelength are monitored. The wavelength may be controlled by altering a temperature of the light source, e.g., by a thermally cooled unit, and the power may be controlled in accordance with the injection current. Since the power and the wavelength are interdependent, i.e., a change in one parameter affects the other, the best stability is achieved when both are controlled.

Such monitoring and stabilizing systems typically involve using a unit which is external to the radiation source itself. Such external units include crystal gratings, fiber gratings, spectrometers, and Fabry-Perot etalons, both straight and inclined. The grating systems include relatively large control units external to the radiation source. While etalon-based systems offer a more compact solution, so far these etalons are still separate units which may become improperly aligned, either with photodetectors or with optical elements required to direct and control the light onto the photodetectors.

While the parent application addresses the above concerns, it would still be advantageous to provide a wavelength locker which is tunable and/or operates over a plurality of wavelengths. Currently, solutions to this desire for tunability include rotating the etalon to match the wavelength operation to one of the lockable wavelengths and using a waveguide grating to separate the wavelengths output by the source. However, these are not robust over a variety of operating conditions and cannot be integrated on a wafer level. Other configurations have used a stepped etalon, but with no integration thereof.

SUMMARY OF THE INVENTION

The present invention is therefore directed to a wavelength monitor/locker for use with more than one wavelength which substantially overcomes one or more of the problems due to the limitations and disadvantages of the related art.

It is an object of the present invention to provide an integrated wavelength locker which operates for more than one wavelength.

These and other objects may be realized by providing a wavelength locker including a first photodetector which receives a first portion of a beam from a light source, a second photodetector which receives a second portion of the beam, a substrate including an etalon in a path upstream of the first photodetector, the substrate including another element which performs an optical function, the etalon having at least two sections presenting different free spectral ranges. The at least two sections being traversed by the first portion of the beam and a connector which supplies outputs of the first photodetector and the second photodetector to a wavelength controller of the light source.

The wavelength locker of may include a divider which forms the first and second portions of the input beam. The divider may include a diffractive grating which deflects a portion of the input beam into higher orders. The diffractive grating may be polarization insensitive.

The wavelength locker may include an optics block which directs the first and second beams to the first photodiode and the second photodiode, respectively. The divider may be integrated on the optics block. The optics block may provide at least one of collimating and focusing to at least one of the input beam, the first beam and the second beam. The at least two of the etalon, the divider and the optics block may be bonded together on a wafer level and diced to form that portion of the wavelength locker.

The wavelength locker may include a mount substrate on which the first photodetector and the second photodetector are mounted. The mount substrate may have a hole therein between the first photodetector and the second photodetector. The mount substrate has a transparent region therein between the first photodetector and the second photodetector. The wavelength locker may include a spacer between the mount substrate and the etalon. The mount substrate may have a recess therein in which the first photodetector and the second photodetector are mounted. The another element which performs an optical function is at least one of a refractive element and a diffractive element. The optics block may reflect the first and second portions of the input beam to the first photodetector and the second photodetector, respectively. The optics block provides multiple reflections to the first and second portions of the input beam to direct them to the first photodetector and the second photodetector, respectively.

The etalon may be solid. The etalon may have a gap between opposing reflective portions thereof. A third portion of the beam may be output as an application beam to be directed to further applications.

The another element which performs an optical function may be another etalon upstream of the second photodetector, the another etalon having a different path length than the etalon upstream of the first photodetector. The another element which performs an optical function may be a divider forming said first and second portions of the beam. The another element which performs an optical function may operate on the third portion of the beam.

The another element performs at least one of collimating and focusing of the third portion of the beam. All optical elements for providing the first and second beams to the first and second photodetectors may be on a single wafer or a wafer bonded thereto.

The above and other object may be realized by providing a wavelength monitor including a first detector, a second detector, a third detector, a first filter in an optical path upstream of the first detector, a second filter in an optical path upstream of the second detector, a third filter in an optical path upstream of the third detector, the first, second, and third filters having different filter properties from one another, and an optical element which directs at least a portion of the beam onto each of said first, second, and third detectors through said first, second and third filters, respectively. A processor receives outputs from the first, second and third detectors, and determines the wavelength of the beam.

At least one of the first, second, and third filters may be an etalon or each may be an etalon presenting a different free spectral range for each of the first, second and third detectors. The different spectral ranges may be provided using etalons of different apparent thicknesses. The different apparent thicknesses may be provided using different physical thickness. The different apparent thicknesses may be provided using different relative angles between the etalon and portions of the beam.

The first, second and third detectors may be part of a single detector array. There may be no reference detector.

At least one of the first, second and third filters output a periodic signal with respect to wavelength or each of the first, second and third filters output a periodic signal with respect to wavelength. The periodic signal may approximate a sinusoid.

The above and other objects may be realized by providing a wavelength monitor including a first detector receiving a first signal, a second detector receiving a second signal, a third detector receiving a third signal, wherein the first, second, and third signals are each periodic with respect to wavelength and a set having a value for each of the first, second and third signals represents a unique wavelength within a continuous operational range. An optical element directs at least a portion of the beam onto each of the first, second, and third detectors. A processor receives outputs from the first, second and third detectors, and determines the wavelength of the input beam.

At least one of the first, second, and third signals may be created using an etalon or each of the first, second, and third signals may be created using an etalon. At least one of the first, second, and third signals approximate a sinusoid. For each wavelength within the continuous operational range, at least one of the signals has a non-zero slope.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known devices and methods are omitted so as not to obscure the description of the present invention with unnecessary details.

Figure 1:
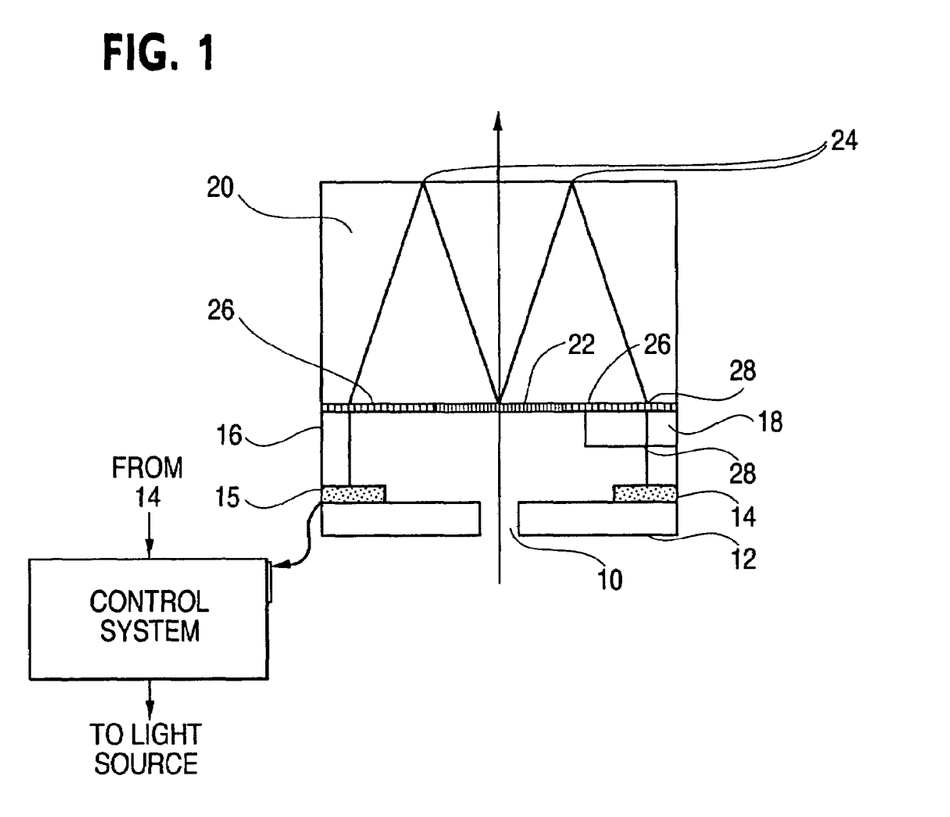
FIG. 1 is a cross-sectional view of an embodiment of the integrated wavelength locker of the present invention.

FIG. 1 illustrates a general embodiment of the integrated wavelength locker of the present invention. The integrated wavelength locker includes a substrate 12 for mounting photodetectors 14, 15. The substrate 12 also includes an aperture 10 therein between the photodetectors. An etalon 18 includes opposing reflective portions 28, e.g., a reflective dielectric stack, on opposite surfaces thereof to form an etalon in the path of a first photodetector 14. The path of a second photodetector 15 does not include an etalon. An optics block 20 has a diffractive grating 22 on a bottom surface thereof and two reflective portions 24 on a top surface thereof. The optics block 20 may also include an optical element on the top and/or bottom surface thereof in the path of the straight through beam, e.g., for focusing and/or collimating the beam. Metallization pads may be provided to supply electrical connection for the active elements and for the outputs of the photodetectors 14, 15 to be provided to a control system for controlling the light source being monitored. A spacer 16 is provided between the substrate 12 of the photodetectors 14, 15 and the optics block 20.

As can be seen in FIG. 1, light from a light source, e.g., a semiconductor laser or light emitting diode, passes through the aperture 10 in the substrate 12 on which the photodetectors 14,15 are mounted. A small amount of the light is deflected by the diffraction grating 22, with most of the light being in the zero order, so it passes straight through the diffraction grating 22. The diffracted light then impinges upon the reflective portions 24 on the top surface of the optics block 20. The reflective portions 24 direct the light back toward optical elements 26, which deflect the light and direct it to the photodetectors 14, 15.

The opposing reflective portions 28 of the etalon block 18 are designed such that a predetermined transmission there through occurs at the desired output wavelength of the light source. The reflective portions 28 are parallel to one another and the etalon has a thickness d and an index of refraction n. The phase delay δ is given by the following:

$$\delta = 4\pi n d \cos \theta / \lambda \quad (1)$$

where θ is the angle of incidence internal to the etalon and λ is the wavelength. The maximum transmission thus occurs when the phase delay δ is an integer multiple of 2π. For a given refractive index, incidence angle, and desired wavelength, the thickness of the etalon may be determined to provide any desired value of the phase delay. This phase delay in turn will determine the amount of transmittance at the desired wavelength. The transmittance is the ratio of the reflected irradiance $I_r$ to the incident irradiance $I_i$, which is given by:

$$\frac{I_r}{I_i} = \frac{1}{1 + [4R/(1-R)]^2 \sin^2 \delta/2} \quad (2)$$

where R is the reflectivity of the etalon and δ is determined from equation (1). Deviation from this desired transmittance indicates drifting away from the desired wavelength, and is to be corrected.

In the particular embodiment shown in FIG. 1, the amount of light received by the first photodetector 14 is compared to the amount of light received on the second photodetector 15 in order to insure any change in the amount of light on the first photodetector 14 is due to a shift in wavelength, rather than some power fluctuation in the light source output. The outputs of the first photodetector 14 and the second photodetector 15 are fed to a processor or control system 30 to determine any shift in wavelength and to control the wavelength output by the light source in accordance with this shift. Such a control system 30 may include altering the temperature of the light source, e.g., by controlling a thermoelectric cooler on which the light source is mounted, altering an injection current, and/or altering a length of an external cavity, such as a microelectronic mechanical device, as known in the art. The control system 30 may alter the parameters of the light source by a predetermined amount or by an amount in accordance with the degree of shift indicated by the photodetectors 14, 15.

The predetermined transmission of the etalon formed by the reflective portions 28 is given by may be at any desired position on the response curve of the etalon. For example, the etalon formed by the reflective portions 28 may be designed to provide a maximum transmission, e.g., 100%, at the desired wavelength. While providing the maximum transmission at the desired wavelength allows the difference in transmission arising from any shift in wavelength to be readily detected, the direction of this wavelength shift will not be known, since an identical shift in either direction will result in the same change in transmission. Therefore, the shift is assumed to be in a particular direction. If the resulting change leads to a further decrease in transmission, the shift was actually in the opposite direction and the control of the light source will be adapted accordingly. Of course, the analogous logic would apply if the etalon formed by the reflective portions 28 was designed to provide a minimum transmission at the desired wavelength.

Alternatively, the etalon formed by the reflective portions 28 may be designed to provide transmission at an inflection point, e.g., the average transmission, of the response curve. At an inflection point, the direction of the transmission change will indicate the direction of the wavelength shift and the sensitivity to the wavelength shift is increased as compared with providing the transmission of the desired wavelength at a maximum or minimum. While the etalon formed by the reflective portions 28 may be designed to provide any transmission to the desired wavelength, care must be taken to insure that this point is sufficiently removed from any flat portions of the response curve of the etalon such that the maximum desired deviation from the desired wavelength remains discernable. How rapidly the irradiance drops off on either side of the maximum is determined by the reflection coefficient of the reflective portions 28, with the drop off increasing with increasing reflectivity.

While the embodiment in FIG. 1 has assumed a hole or aperture 10 is needed through the substrate on which the photodetectors 14, 15 are mounted, this substrate could also be transparent, e.g., a silicon substrate. However, it is often desirable to have the hole 10 therein, since if the light is incident on the substrate at an angle, the beam shift will be exaggerated if through the substrate rather than through the hole 10.

While the configuration shown in FIG. 1 is for wavelength lockers in the primary path of an application light beam, e.g., for edge emitting light sources with insufficient light output from a back facet thereof or for surface emitting light sources, the wavelength locker of the present invention may also be used when the beam is not to be further employed, e.g., from the back facet of an edge emitting light source. In this scenario, the light is just directed through the etalon to the detectors, without having to worry about the beam proceeding onto the application.

The inverted "W" wavelength locker shown in FIG. 1, by using reflective portions 24 to fold the beams, allows the separation of sampled beams, etalon and reference to be large enough to realize packaging of the detectors 14, 15 in the system without having to manufacture diffractives with extremely small features size and more than two phase levels.

Figure 2A:
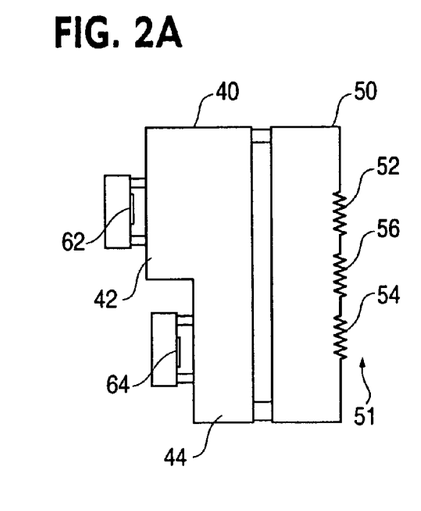
FIG. 2A is a cross-sectional view of an embodiment of an etalon-detector configuration of the present invention for use with more than one wavelength.

FIG. 2A illustrates one embodiment of an etalon 40 of the present invention which may be used for more than one wavelength, due to steps 42, 44 of the etalon 40. The etalon 40 may be created by etching a wafer to a desired depth for each of the steps 42, 44, and then depositing a metal thereon to make both surfaces highly reflective. The etalon 40 is bonded to a block 50 containing a collimating element 51. Detectors 62, 64 may be bonded to the etalon 40, before or after bonding the etalon 40 to the block 50. If the etalon 40 is individually provided, the etalon 40 may be bonded to a wafer containing a plurality of optics blocks 20, e.g., by pick and place techniques. If the block 50 is to be separate from the optics block 20, a plurality of etalons 40 may be provided on a wafer level, bonded to a wafer of blocks 50 and then diced, with the detectors 62, 64 being bonded before or after the bonding of the block 50 and the wafer containing the plurality of etalons 40. The block 50 and the etalon 40 are preferably made of the same material, e.g., silicon or fused silica, to facilitate bonding. The stepped etalon 40 is thus replaces the etalon 18 in FIG. 1 to form the wavelength locker.

The collimating element 51 may be either refractive and/or diffractive and may include three regions. A first region 52 collimates light incident thereon and directs it towards step 42 and detector 62. Similarly, a second region 54 collimates light incident thereon and directs it towards step 44 and detector 64. A third region 56 is a highly transmissive scattering region preventing light from feeding back into the light source. The remainder of the input surface of block 50 may be a light-blocking region.

Figure 2B:
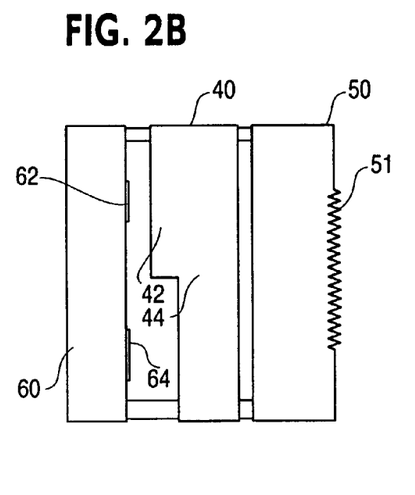
FIG. 2B is a cross-sectional view of an embodiment of an etalon-detector configuration of the present invention for use with more than one wavelength.
Figure 2C:
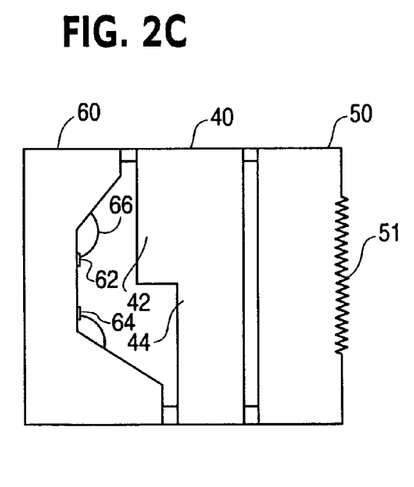
FIG. 2C is a cross-sectional view of an embodiment of etalon-detector configuration of the present invention for use with more than one wavelength.

In FIG. 2B, the detectors 62, 64 are on a substrate 60, allowing them to be bonded on a wafer level with the etalon 40, before or after bonding of the etalon 40 and the block 50. In FIG. 2C, the substrate 60 include a valley 65 for allowing easier provision of wire bonds 66 for connecting the detectors 62, 64 to a power source and/or to the control system 30.

Figure 2D:
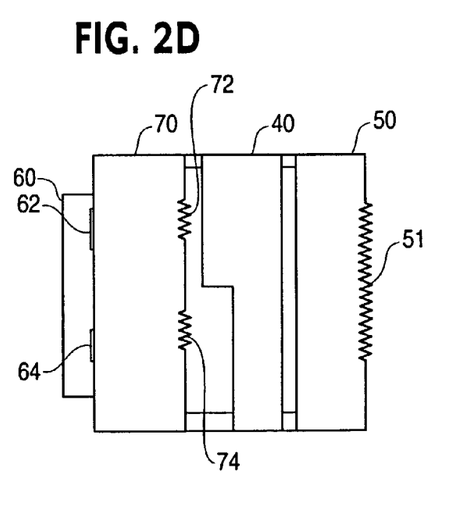
FIG. 2D is a cross-sectional view of an embodiment of an etalon-detector configuration of the present invention for use with more than one wavelength.

If more power is needed on the detectors, so that aperture needs to be larger, but a small detector size is still desired to reduce cost, a focusing block 70 with focusing elements 72, 74 thereon, may be provided, e.g., between the etalon 40 and the detectors 62, 64, as shown in FIG. 2D. This focusing block 70 may also be integrated on the wafer level, thus not seriously affecting the cost or difficulty of assembly.

The stepped configuration noted above is particularly useful for tuning a light source when the steps are created to present an integral number of a desired wavelength to the light beam. The light source will be tuned to the desired wavelength when the power incident on both detectors 62, 64 is equal.

Figure 3A:
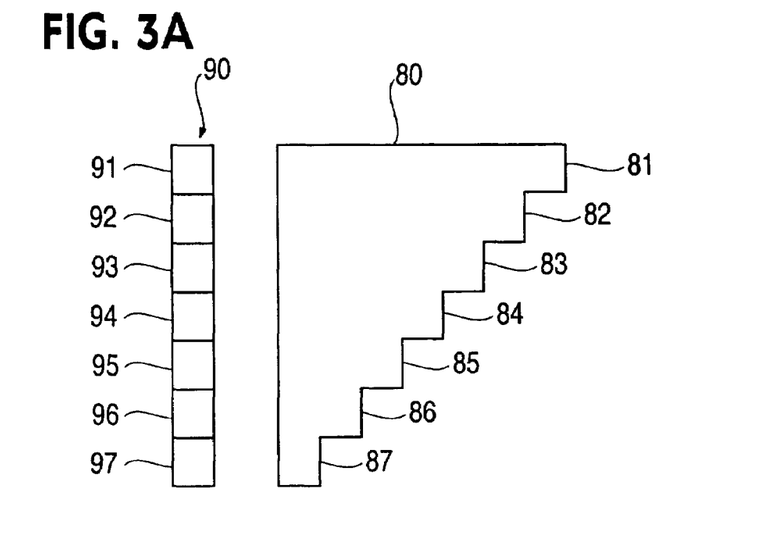
FIG. 3A is a cross-sectional view of an embodiment of an etalon-detector configuration of the present invention for use with a plurality of wavelengths.
Figure 3B:
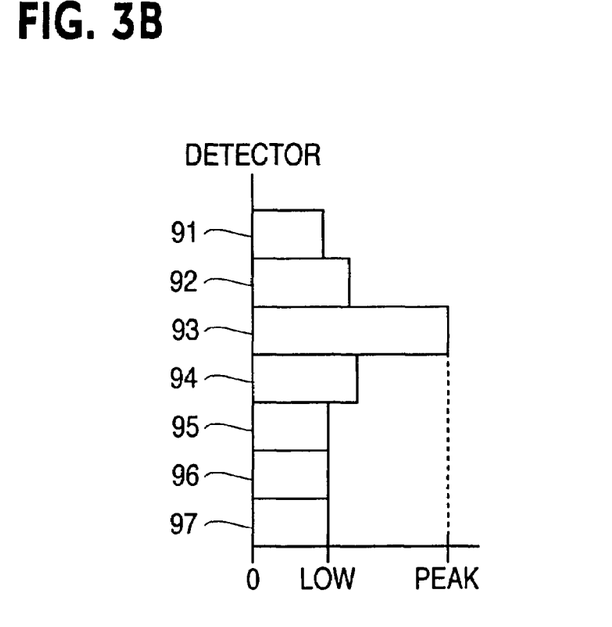
FIG. 3B is a plot of the output from the configuration of FIG. 3A for a particular wavelength.

To facilitate use of the integrated wavelength locker for a plurality of wavelengths within some range, an etalon 80 having a plurality of steps 81–87, each corresponding to a specific wavelength may be used, as shown in FIG. 3A. A linear detector array 90, having a corresponding plurality of detector regions 91–97 is mounted with the etalon 80, here opposite the steps 81–87. The spacing of the steps 81–87 is preferably equal to the pitch of the linear detector array 90. When a collimated beam from a light source is incident on all of the steps 81–87, the maximum signal detected by the linear detector array 90 is the detector element for the step corresponding to the wavelength of the input beam. For example, when the wavelength of the input beam is equal to the spacing provided by step 83, the output of the corresponding detector element 93 will be larger than for the remaining detector elements, as shown in FIG. 3B. Thus, the light source may be tuned by sweeping its temperature and current to maximize the output on a particular detector element that corresponds to a desired wavelength.

Figure 4A:
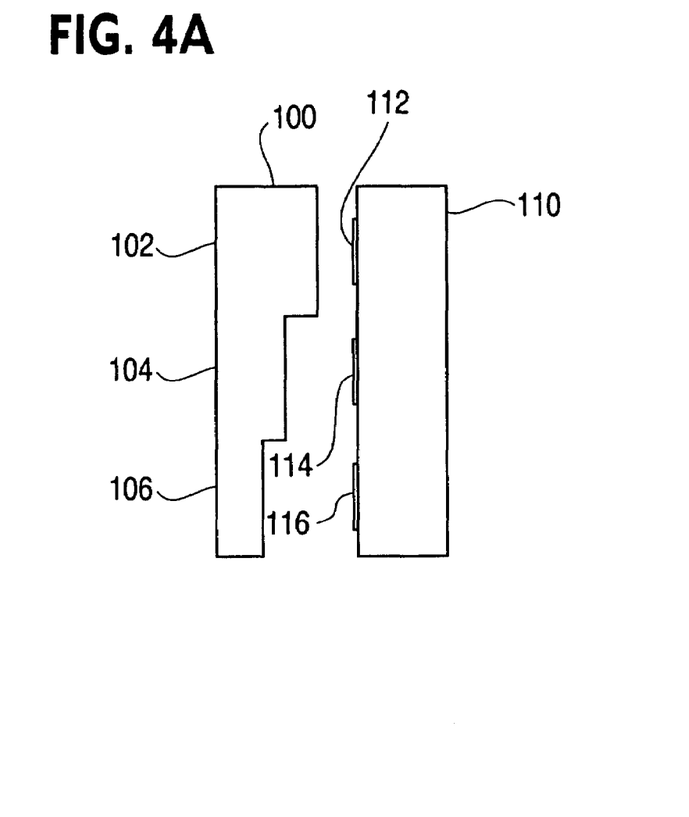
FIG. 4A is a cross-sectional view of an embodiment of an etalon-detector configuration of the present invention for a continuous wavelength range.

When the wavelength locker is to operate over a continuous range of wavelengths, rather than at a plurality of discrete wavelengths, an etalon 100 as shown in FIG. 4A may be used. This configuration eliminates the requirement for a separate reference monitor. By using a phase shift in the reference leg, from interferometry techniques, a system of three equations and three unknowns can be generated. This is because the etalon transmission intensity is similar to the interferometer fringe intensity. The reference beam intensity can then be solved for, rather than monitored independently. The relevant equations for phase shifting interferometry are:

$$I_i(x,y) = I_R(x,y) + I'(x,y)\cos(\phi(x,y)+\beta_i) \quad (3)$$

where $I_i$ is the intensity for each beam, $I_R$ is the reference intensity, $I'$ is the intensity of the input beam, $\phi$ is the phase of the input beam, and $\beta_i$ is the reference beam phase for each step, where $\beta_0=0$, $\beta_1=\pi/2$ and $\beta_2=\pi$.

Dropping the (x,y) position dependency for simplicity, the solutions for the three unknowns are:

$$I_R = \frac{I_0 + I_2}{2} \quad (4)$$

$$I' = 2\sqrt{(I_0-I_2)^2 + (2I_1-I_0-I_2)^2} \quad (5)$$

$$\phi + \arctan\left(\frac{I_2 - I_1}{I_0 - I_1}\right) \quad (6)$$

Figure 4B:
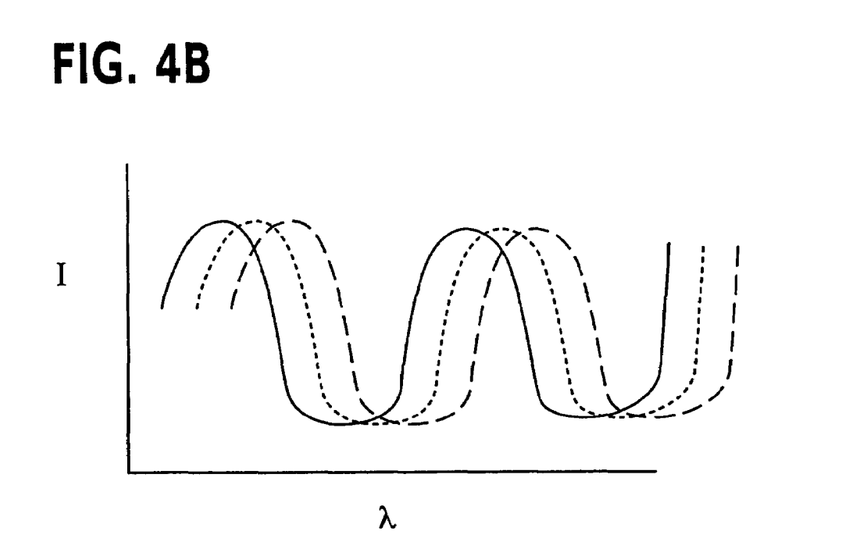
FIG. 4B is a plot of the output of the respective detectors for the different steps of the etalon of FIG. 4A.

A similar set of equations exists to reconstruct wavelength information from the at least three etalon signals. The transmission intensity as a function of wavelength for each of the etalon steps is shown in FIG. 4B. As can be seen therein, the transmission intensity is periodic, but not sinusoidal. Since the following equations assume the transmission is sinusoidal, the transmission equation for the stepped etalon can be approximated as:

$$I_i = \frac{I_R}{1 + \left(\frac{F}{2+F}\right)\cos\left(4\pi n d_i \frac{\cos\theta}{\lambda}\right)} \quad (7)$$

$$F = \frac{4R}{(1-R)^2} \quad (8)$$

where F is the coefficient of finesse for the etalon, R is the reflectance of the surfaces of the etalon, n is the index of refraction within the etalon, $d_i$ is the thickness of the etalon, where $d_i = d_0 - i\Delta$, and $\Delta$ is the etalon step height, $\theta$ is the angle of the light within the etalon and $\lambda$ is the wavelength of light.

For low to moderate finesse values, both the function and its first derivative and smooth and continuously varying, i.e., a small shift in wavelength will produce a change in intensity for most wavelength values. However, where the slope of the curve approaches zero, this no longer holds true. This can be rectified by introducing two other etalon steps (or other changes in finesse) which are shifted relative to one another so that at least one curve will have a sufficiently steep slope when slopes of other curves approaches zero. Also, rather the providing a separate reference beam structure, one of the three beams serves as the reference. The system can be expanded to more than three etalon-detector pairs to reduce sensitivity to errors in the etalon step height and system noise. Further, since the relative shift is used to determine the wavelengths, which are characterized a priori, the requirements on the accuracy of the etalon steps is reduced, allowing the stepped etalon to be manufactured more cheaply.

The above interferometric approach may be used whenever there are at least three signals having a periodic nature with respect to wavelength. As used herein, "periodic" does not mean strict repeatability, only that the signal is sufficiently repeatable to allow interferometric equations to be used. In order to insure accurate identification of the wavelength, the periodic signals should be spaced relative to one another such that their flatter portions do not all overlap, i.e., a set consisting of a value for each of the detectors will uniquely identify the wavelength in a given range. In other words, at any coordinate, at least one signal has a steep enough slope to allow a change in wavelength to be detected. The properties of the diffractive elements and the transmittance properties of materials used in the system will determine the operational wavelength range.

The continuous nature of the wavelength determination results in a configuration for which the elements do not have to be altered if there is a change in spacing between the wavelengths being used. Further, the above configuration does not rely on a reference beam to accurately determine the wavelength, also rendering the configuration easily adaptable to changing requirements. However, the longer the period, the worse the accuracy, since the more likely two signals are to be substantially flat over the same wavelength region. This may be compensated for by including more steps, or other finesse variations. The spacing between the steps may be the same or may have the same periodicity as channel spacing for a system in which the wavelength locker is to be used.

Figure 5A:
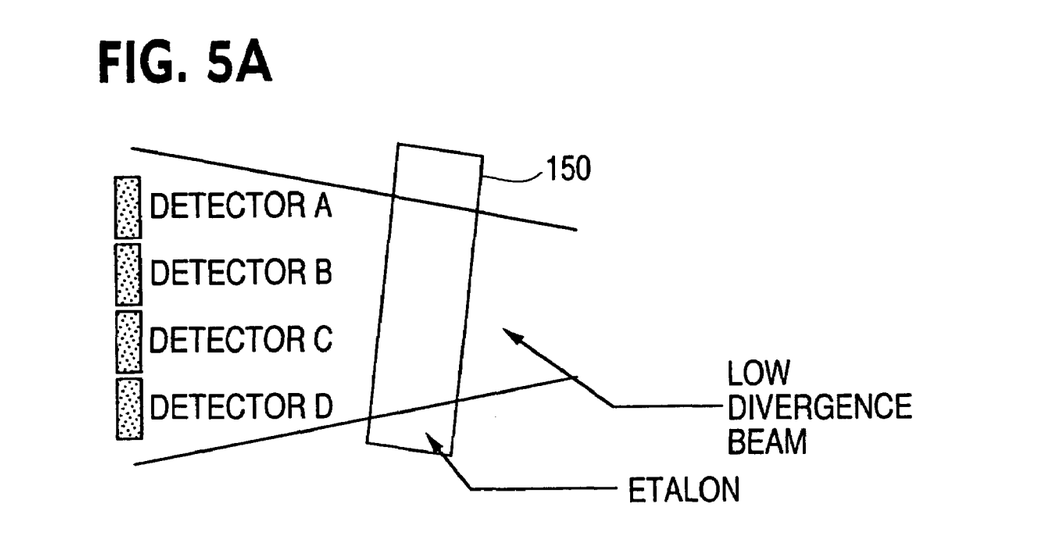
FIG. 5A is a cross-sectional view of another embodiment of an etalon-detector configuration of the present invention for a continuous wavelength range.
Figure 5B:
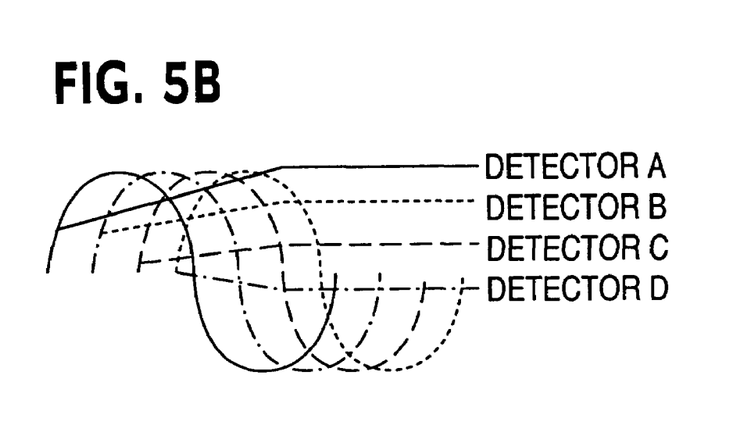
FIG. 5B is a plot of the output of the respective detectors for the different detectors of FIG. 5A.

An alternative continuous etalon-detector configuration is shown in FIG. 5A, in which a tilted etalon 150 rather than a stepped etalon is used. The etalon 150 is designed to be used at a tilt. If the sampled beam is diverging, when combined with the tilted etalon 150, the beam will be incident on a plurality of detectors A–D out of phase with one another, producing an output as shown in FIG. 5B, which looks like the output in FIG. 4B, except with four detectors shown in this particular example. As the number of detectors increases within the 360-degree spacing, the resolution of the system increases.

One way of positioning the detectors is to use a one-dimensional array of detectors with small pitch and select the detectors that provide the appropriate spacing in the phase regime. Alternatively, the signal may be processed form detectors having unequal phase spacing as long as the differences between phase steps are known.

For all of the continuous wavelength variations, the exact parameters of the etalon are not critical as long as they are characterized before use to determine the response thereof. As long as the free spectral ranges for at least three detectors are different, the beam can be used to provide continuous locking across a range. Once the etalon has been characterized, the crossing points of the detector outputs will identify the wavelength.

Figure 6A:
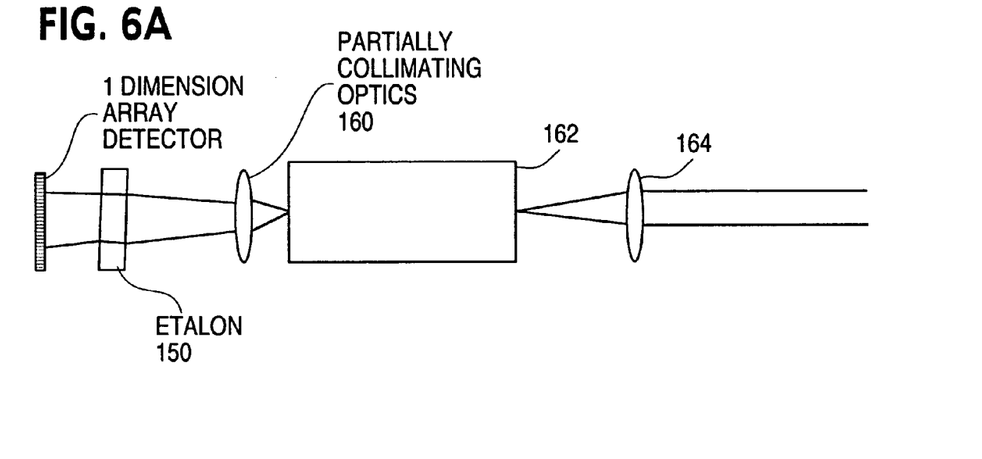
FIG. 6A is a cross-sectional view of the continuous wavelength embodiment incorporated into a back facet wavelength locker.

For the continuous wavelength configurations, use with a back facet wavelength locker is very simple, since the beam from the back facet of a light source 162 is already diverging and all of the light passes through the etalon, i.e., there is no separate reference beam. Such a configuration is shown in FIG. 6A, in which the only optics having power which may be required for the wavelength locker is a partially collimating element 160. The element 160 reduces the divergence from the light source 162 if needed, but retains enough divergence to enhance the effect of the tilt of the etalon when the etalon 150 is as shown in FIG. 5A and/or to insure coverage of the etalon in any of the continuous wavelength configurations. The application beam from the front facet of the light source 162 may be fully collimated by an optical element 164.

Figure 6B:
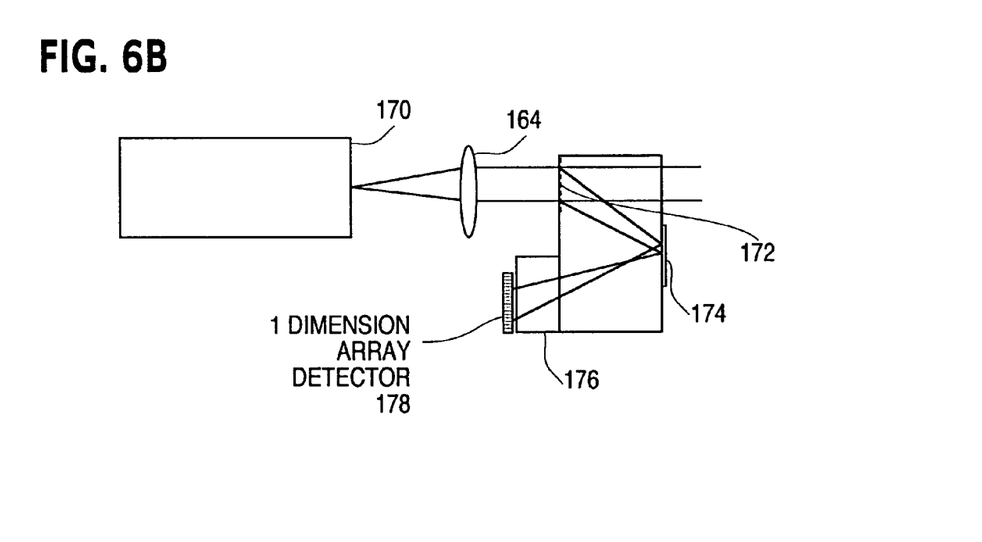
FIG. 6B is a cross-sectional view of the continuous wavelength embodiment incorporated into a front facet wavelength locker.

Use of the continuous wavelength configurations with a front wavelength locker is shown in FIG. 6B. Here, as in FIG. 1, a portion of the application beam must be split off without affecting the application and with minimum power loss. The configuration also includes a collimating element 164 which collimates the light output from the light source 170, a splitter 172, a reflection portion 174, a continuous wavelength etalon 176 having at least three different finesses, and corresponding detectors 178. Unlike the splitting portion in FIG. 1, the splitter 172 in FIG. 6B only needs to provide one beam. Either the splitter 172 or the reflective portion 174 must have some power therein to render the beam divergent when incident on the etalon 176. To obtain a large cross-section of the beam, while controlling the size of the wavelength locker, at least one reflective portion 174 is provided to direct the beam onto the etalon-detector configuration.

In all of the configurations, the integrated wavelength locker is preferably formed on a wafer level, as set forth, for example, in commonly assigned, co-pending application Ser. No. 08/943,274, allowed, entitled "Wafer Level Integration of Multiple Optical Elements" which is hereby incorporated by reference in its entirety for all purposes. Preferably, a plurality of all the elements of the wavelength locker are bonded together at the wafer level and then diced to create the individual wavelength lockers. The material for the reflective portions is also preferably selectively deposited on a wafer level. Apertures for either the holes or spacers may also be formed on the wafer level.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation. Thus, the scope of the invention should be determined by the appended claims and their legal equivalents, rather than by the examples given.

What is claimed is:

1. A wavelength locker comprising:
   a first photodetector which receives a first portion of a beam from a light source;
   a second photodetector which receives a second portion of the beam;
   a substrate including an etalon in a path upstream of the first photodetector, the substrate including another element which performs an optical function, the etalon having at least two sections presenting different free spectral ranges, said at least two sections being traversed by said first portion of the beam; and
   a connector which supplies outputs of the first photodetector and the second photodetector to a wavelength controller of the light source.

2. The wavelength locker of claim 1, further comprising a divider which forms said first and second portions of the beam.

3. The wavelength locker of claim 2, where said divider includes a diffractive grating which deflects a portion of the beam into higher orders.

4. The wavelength locker of claim 3, wherein the diffractive grating is polarization insensitive.

5. The wavelength locker of claim 1, further comprising an optics block which directs the first and second beams to the first photodetector and the second photodetector respectively.

6. The wavelength locker of claim 5, further comprising a divider which forms said first and second portions of the beam, said divider being integrated on the optics block.

7. The wavelength locker of claim 5, wherein the optics block provides at least one of collimating and focusing to at least one of the beam, the first beam and the second beam.

8. The wavelength locker of claim 6, wherein at least two of the etalon, the divider and the optics block are bonded together on a wafer level and dived to form that portion of the wavelength locker.

9. The wavelength locker of claim 1, farther comprising a mount substrate on which the first photodetector and the second photodetector are mounted.

10. The wavelength locker of claim 9, wherein the mount substrate has a hole therein between the first photodetector and the second photodetector.

11. The wavelength locker of claim 9, wherein the mount substrate has a transparent region therein between the first photodetector and the second photodetector.

12. The wavelength locker of claim 9, further comprising a spacer between the mount substrate and the etalon.

13. The wavelength locker of claim 9, wherein the mount substrate has a recess therein in which the first photodetector and the second photodetector are mounted.

14. The wavelength locker of claim 1, wherein the another element which performs an optical function is at least one of a refractive element and a diffractive element.

15. The wavelength locker of claim 5, wherein the optics block reflects the first and second portions of the input beam to the first photodetector and the second photodetector, respectively.

16. The wavelength locker of claim 15, wherein the optics block provides multiple reflections to the first and second portions of the beam to direct them to the first photodetector and the second photodetector, respectively.

17. The wavelength locker of claim 1, wherein the etalon is solid.

18. The wavelength locker of claim 1, wherein the etalon has a gap between opposing reflective portions thereof.

19. The wavelength locker of claim 1, further comprising a third portion of the beam being output as an application beam to be directed to further applications.

20. The wavelength locker of claim 1, wherein the another element which performs an optical function is another etalon upstream of the second photodetector, the another etalon having a different path length than the etalon upstream of the first photodetector.

21. The wavelength locker of claim 1, wherein the another element which performs an optical function is a divider forming said first and second portions of the beam.

22. The wavelength locker of claim 19, wherein the another element which performs an optical function operates on the third portion of the beam.

23. The wavelength locker of claim 22, wherein the another element performs at least one of collimating and focusing of the third portion of the beam.

24. The wavelength locker of claim 1, wherein all optical elements for providing the first and second beams to the first and second photodetectors are on a single wafer or a wafer bonded thereto.

* * * * *